(12) United States Patent
Takanezawa et al.

(10) Patent No.: US 7,572,503 B2
(45) Date of Patent: Aug. 11, 2009

(54) METHOD FOR PREPARING AN INSULATING RESIN COMPOSITION, INSULATING RESIN COMPOSITION, MULTILAYER WIRING BOARD AND PROCESS FOR PRODUCING THE SAME

(75) Inventors: Shin Takanezawa, Shimodate (JP); Koji Morita, Shimodate (JP); Takako Watanabe, Shimodate (JP); Toshihisa Kumakura, Shimodate (JP); Hiroyuki Fukai, Shimodate (JP); Hiroaki Fujita, Shimodate (JP)

(73) Assignee: Hitachi Chemical Co., Ltd., Shinjuku-ku (JP)

( * ) Notice: Subject to any disclaimer, the term of this patent is extended or adjusted under 35 U.S.C. 154(b) by 0 days.

(21) Appl. No.: 11/165,345

(22) Filed: Jun. 24, 2005

(65) Prior Publication Data

US 2005/0255270 A1 Nov. 17, 2005

Related U.S. Application Data

(62) Division of application No. 10/773,220, filed on Feb. 9, 2004, now Pat. No. 6,979,712.

(30) Foreign Application Priority Data

Feb. 18, 2003 (JP) ............................. 2003-039456

(51) Int. Cl.
*B32B 9/00* (2006.01)
(52) U.S. Cl. ................. 428/355 EP; 174/258; 428/209; 428/344; 428/352; 428/355 CN; 428/901
(58) Field of Classification Search ................. 428/209, 428/344, 355 EP, 355 CN, 356, 352, 901; 174/258
See application file for complete search history.

(56) References Cited

U.S. PATENT DOCUMENTS

| | | | | |
|---|---|---|---|---|
| 4,762,747 A | * | 8/1988 | Liu et al. | ..................... 428/343 |
| 5,095,077 A | | 3/1992 | Gardeski | |
| 5,837,155 A | | 11/1998 | Inagaki et al. | |
| 5,874,009 A | * | 2/1999 | Inada et al. | .................... 216/20 |
| 5,945,222 A | * | 8/1999 | Nagase et al. | ............... 428/416 |
| 6,486,242 B1 | | 11/2002 | Tobisawa et al. | |
| 6,586,526 B1 | * | 7/2003 | Sekimoto et al. | ............ 525/113 |

FOREIGN PATENT DOCUMENTS

| | | |
|---|---|---|
| DE | 699 07 123 T2 | 4/2004 |
| DE | 69815601 T2 | 4/2004 |
| EP | 1 103 575 A1 | 5/2001 |

(Continued)

OTHER PUBLICATIONS

Coombs, Clyde F. Jr, Printed Circuits Handbook, 1988, pp. 4.11-4.12, 6.3-6.5, 3rd Edition, McGraw Hill.

(Continued)

*Primary Examiner*—Cathy Lam (57) ABSTRACT

Directed to an insulating resin composition which comprises (A) a novolak epoxy resin having a biphenyl structure, (B) carboxylic acid-modified acrylonitrile butadiene rubber particles, (C) a triazine ring-containing cresol novolak phenolic resin, (D) a phenolic hydroxyl group-containing phosphorus compound, and (E) inorganic filler, an insulating film having a support using the same, a multilayer wiring board, and a process for producing a multilayer wiring board.

9 Claims, 2 Drawing Sheets

FOREIGN PATENT DOCUMENTS

| | | |
|---|---|---|
| EP | 1 013 684 B1 | 4/2003 |
| EP | 1 312 638 A1 | 5/2003 |
| EP | 0 893 474 B1 | 6/2003 |
| JP | 8-302161 | 11/1996 |
| JP | 11-87927 A | 3/1999 |
| JP | 2000-256537 | 9/2000 |
| JP | 2001-114871 | 4/2001 |
| JP | 2001-181399 | 7/2001 |
| JP | 2001-247657 | 9/2001 |
| JP | 2001-283639 | 10/2001 |
| JP | 2002-338806 | 11/2002 |
| JP | 2002-338887 | 11/2002 |
| JP | 2002-348353 | 12/2002 |

OTHER PUBLICATIONS

Translation of Office Action dated Apr. 22, 2005 in corresponding German application DE 10 2004 006 312.5.

Japanese Office Action issued in corresponding Japanese Patent Application No. 2003-039456, completed Oct. 28, 2008.

English translation of the Japanese Patent Office Action 2003-039456, completed Oct. 28, 2008.

* cited by examiner

METHOD FOR PREPARING AN INSULATING RESIN COMPOSITION, INSULATING RESIN COMPOSITION, MULTILAYER WIRING BOARD AND PROCESS FOR PRODUCING THE SAME

This application is a divisional of U.S. patent application Ser. No. 10/773,220, filed Feb. 9, 2004, which claims priority from Japanese Patent Application No. 2003-39456, filed Feb. 18, 2003. The entire disclosures of the above patent applications are hereby incorporated by reference.

FIELD OF THE INVENTION

The present invention relates to an insulating resin composition, an insulating film having a support using the same, a multilayer wiring board, and a process for producing a multilayer wiring board.

BACKGROUND ART

As a process for producing a multilayer wiring board, the following process is general. A material, which is prepared by impregnating glass cloth with an epoxy resin and semi-curing the resin (called prepreg), and a copper foil are stacked on an insulating substrate having a circuit pattern formed, and they are laminated together by means of a hot press. Then, a hole for interlayer connection is formed in the resultant laminate by means of a drill, and subsequently the inner wall of the hole and the surface of the copper foil are subjected to electroless plating and, if necessary, further subjected to plating to form a conductor layer having a required thickness. Then, unnecessary copper is removed to form a circuit pattern.

In recent years, electronic apparatus are being further reduced in size, reduced in weight, and increased in function. In accordance with this tendency, the integration degree of LSIs or chip parts is increased, and their form is rapidly changed to one having many pins or a reduced size. Therefore, for increasing the mounting density of electronic parts, the development of refined wiring on a multilayer wiring board is progressed. As a method for producing a multilayer wiring board which meets the demands, there is a build-up process in which no glass cloth is used and an insulating resin composition is used instead of a prepreg to form an insulating layer, and interlayer connection is made only for a required portion through a via hole to form a multilayer structure. This process is being mainly used as a method which meets the demands of weight reduction, size reduction, and refining.

With respect to the insulating resin composition used in the build-up process, for example, there is an adhesive film having excellent circuit filling properties (see, for example, Japanese Unexamined Patent Publication No. 87927/1999). In addition, a resin composition having excellent handling properties when it is in a semi-cured state and having excellent flame retardancy has been disclosed (see, for example, Japanese Unexamined Patent Publication No. 256537/2000).

In the production of a multilayer wiring board, when an insulating layer is formed from an insulating resin composition without using glass cloth, the mechanical physical properties of the insulating layer largely affect the properties of the multilayer wiring board. Specifically, when the insulating layer is rigid and has a small elongation and brittle properties, crack or breakage is caused in the insulating layer during punching out of the multilayer wiring board into product size, which considerably adversely affects the conduction or insulation reliability. For improving the insulating layer in elongation, generally, a method in which a thermoplastic resin having a high molecular weight is introduced into the insulating resin composition is employed. However, the introduction of such a resin poses a problem in that the glass transition temperature of the resultant resin composition is lowered, and in that the coefficient of thermal expansion is increased or the electric properties become poor.

In addition, when using no glass-cloth, the insulating layer is likely to suffer large thermal expansion and a difference is caused between the insulating layer and a base material, a conductor (copper), or solder with respect to the coefficient of expansion, so that crack may be caused in the insulating layer, thus considerably lowering the connection reliability. A generally required coefficient of thermal expansion of the insulating layer is at a level of $50 \times 10^{-6}/°$ C. or less (average value in the range of 30 to 100° C.).

Further, the data processing rate is currently increased, and hence a lowering of the transmission loss is further important. Currently, the amount of data in a high frequency region is especially increased, and therefore an insulating resin which can exhibit a permittivity of 3.5 or less and a dielectric loss of 0.015 or less in a 1 GHz region is needed.

There has been currently desired an insulating resin composition having the above-mentioned performance, namely, insulating resin composition which is cured to form an insulating layer which simultaneously satisfies, firstly, such a large elongation that the insulating layer can endure mechanical or thermal stress concentration, secondly, such a low coefficient of thermal expansion that the connection reliability can be maintained even after the repeated use at low and high temperatures, and, thirdly, such excellent electric properties that the permittivity and dielectric loss are low.

In addition to the above-mentioned performance, the insulating resin composition is recently required to form an insulating layer having excellent bonding properties to a conductor layer. In the refining of wiring, from the viewpoint of achieving excellent etching accuracy upon forming a circuit, it is preferred that the roughness of the interface through which the insulating layer and the conductor layer are bonded is smaller. A low profile foil has currently been practically used in which the roughness of the roughened copper foil is lowered from a conventional value of between 7 to 8 μm (Rz) to between 3 to 4 μm (Rz). However, such a low profile foil is likely to be lowered in the bond strength to the conductor layer and insulating layer. Therefore, an insulating resin composition which can exhibit high bond strength even to a low profile foil is desired. Furthermore, for preventing environmental problems, the insulating resin composition is required to have excellent flame retardancy although it is free of a halogen. Generally, the performance of a non-halogen flame retardant is often not as good as that of a halogen flame retardant, such as a bromine flame retardant. However, on the other hand, when the flame retardancy is obtained by increasing the amount of the non-halogen flame retardant added to the insulating resin composition, there is a danger that other properties may be adversely affected.

Studies have been made with a view toward solving the above problems. As a result, there has been found an insulating resin composition which comprises (A) a novolak epoxy resin having a biphenyl structure, (B) carboxylic acid-modified acrylonitrile butadiene rubber particles, (C) a triazine ring-containing cresol novolak phenolic resin, (D) a phenolic hydroxyl group-containing phosphorus compound, and (E) inorganic filler. It has been found that the insulating resin composition is advantageous not only in that it exhibits flame retardancy although it is free of a halogen, but also in that a cured film formed from the insulating resin composition realizes such a large elongation that the film can endure stress concentration caused by a mechanical or thermal factor and a coefficient of thermal expansion equivalent to that of a structure containing a reinforcing material, such as glass cloth, and further exhibits excellent high frequency properties.

DISCLOSURE OF THE INVENTION

The present invention 1 is directed to an insulating resin composition which comprises (A) a novolak epoxy resin having a biphenyl structure, (B) carboxylic acid-modified acrylonitrile butadiene rubber particles, (C) a triazine ring-containing cresol novolak phenolic resin, (D) a phenolic hydroxyl group-containing phosphorus compound, and (E) inorganic filler.

The present invention 2 is directed to the insulating resin composition according to the present invention 1, wherein component (C) is a triazine ring-containing cresol novolak phenolic resin having a nitrogen content of 12 to 22% by weight. The present invention 3 is directed to the insulating resin composition according to the present invention 1 or the present invention 2, wherein the ratio of the total number of hydroxyl groups in component (C) and component (D) to the number of epoxy groups in component (A) is 0.6 to 1.3. The present invention 4 is directed to the insulating resin composition according to any one of the present inventions 1 to 3, wherein the ratio of the weight of component (A) to the weight of component (B) is 88/12 to 98/2. Further, the present invention 5 is directed to the insulating resin composition according to any one of the present inventions 1 to 4, wherein the amount of component (D) is 1.5 to 2.5% by weight, based on the total weight of components (A) to (D), in terms of a phosphorus atom.

The present invention 6 is directed to an insulating film comprising an insulating layer and a support (hereinafter referred as "an insulating film having a support"), obtained by semi-curing an insulating resin composition according to any one of the present inventions 1 to 5 on the surface of a support. The present invention 7 is directed to a multilayer wiring board comprising at least one insulating layer, at least one inner layer circuit, at least one outer layer circuit and a substrate (hereinafter referred as "a multilayer wiring board") which comprises an insulating layer obtained by curing a film in an insulating film having a support according to the present invention 6. The present invention 8 is directed to a multilayer wiring board which comprises an insulating layer obtained by curing an insulating resin composition according to any one of the present inventions 1 to 5.

The present invention 9 is directed to a process for producing a multilayer wiring board, which process comprises the steps of: (I) applying an insulating resin composition according to any one of the present inventions 1 to 5 to an inner layer circuit on one side or both sides of a substrate; (II) curing said insulating resin composition to obtain an insulating layer; and (III) forming an outer layer circuit on the surface of said insulating layer. The present invention 10 is directed to a process for producing a multilayer wiring board, which process comprises the steps of: (i) laminating an insulating film having a support according to the present invention 6 on one side or both sides of a substrate; (ii) curing said insulating film in the insulating film having a support to obtain an insulating layer; and (iii) forming an outer layer circuit on the surface of said insulating layer.

BRIEF DESCRIPTION OF THE DRAWINGS

In FIG. 1, 1a designates a first circuit pattern, 1d designates a second circuit pattern, 1g designates a third circuit pattern, 2 designates an insulating substrate, 3 designates a circuit board, 4b designates an insulating resin composition layer, 4e designates an insulating resin composition layer, 5c designates a hole, 5f designates a hole, 6c designates a first insulating layer, and 6f designates a second insulating layer.

BEST MODE FOR CARRYING OUT THE INVENTION

The insulating resin composition of the present invention comprises (A) a novolak epoxy resin having a biphenyl structure, (B) carboxylic acid-modified acrylonitrile butadiene rubber particles, (C) a triazine ring-containing cresol novolak phenolic resin, (D) a phenolic hydroxyl group-containing phosphorus compound, and (E) inorganic filler.

In the present invention, novolak epoxy resin having a biphenyl structure (A) is a novolak epoxy resin containing in its molecule an aromatic ring which is a biphenyl derivative, and examples include epoxy resins represented by the following formula (1):

wherein p represents 1 to 5.

These may be used individually or in combination.

Examples of commercially available products used as novolak epoxy resin having a biphenyl structure (A) include NC-3000S {epoxy resin of formula (1) wherein p is 1.7} and NC-3000S-H {epoxy resin of formula (1) wherein p is 2.8}, each manufactured by Nippon Kayaku Co., Ltd.

In the present invention, carboxylic acid-modified acrylonitrile butadiene rubber particles (B) are particles obtained by copolymerizing acrylonitrile, butadiene, and a carboxylic acid (e.g., acrylic acid or methacrylic acid) and partially crosslinking the product being copolymerized. As the carboxylic acid, acrylic acid is preferred. The size of the particles can be 60 to 80 nm in terms of a primary average particle diameter. These may be used individually or in combination.

As an example of a commercially available product used as carboxylic acid-modified acrylonitrile butadiene rubber particles (B), there can be mentioned XER-91, manufactured by JSR Corporation.

In the present invention, triazine ring-containing cresol novolak phenolic resin (C) is a cresol novolak phenolic resin containing a triazine ring on the main chain of a cresol novolak phenolic resin. The nitrogen content of the triazine ring-containing cresol novolak phenolic resin is preferably 12 to 22% by weight, more preferably 17 to 19% by weight, especially preferably 18% by weight. When the nitrogen content of the molecule is within this range, the dielectric loss does not become too large, and, in preparation of a varnish from the insulating resin composition, the solubility of the composition in a solvent is appropriate and the residual amount of matter undissolved can be lowered. As the triazine ring-containing cresol novolak phenolic resin, ones having a number average molecular weight of 500 to 600 can be used. These may be used individually or in combination.

The triazine ring-containing cresol novolak phenolic resin can be obtained by reacting a cresol, an aldehyde, and a triazine ring-containing compound under conditions at pH of 5 to 9. As the cresol, any of o-, m-, and p-cresols can be used. As the triazine ring-containing compound, melamine, guanamine or a derivative thereof, or cyanuric acid or a derivative thereof can be used.

As an example of a commercially available product used as triazine ring-containing cresol novolak phenolic resin (C), there can be mentioned a triazine ring-containing cresol novolak phenolic resin, PHENOLITE EXB-9829 (nitrogen content: 18% by weight), manufactured by Dainippon Ink & Chemicals Incorporated.

In the present invention, phenolic hydroxyl group-containing phosphorus compound (D) is phosphorus compounds containing a phenolic hydroxyl group represented by the following formula (2):

(2)

wherein n is 0, 1, or 2; when n is 1, $R_4$ represents a hydrogen atom, a linear or branched alkyl group, a cycloalkyl group, an aryl group, or an aralkyl group; when n is 2, $R_4$ each occurrence independently represents a hydrogen atom, a linear or branched alkyl group, a cycloalkyl group, an aryl group, or an aralkyl group, or two $R_4$'s and carbon atoms bonded thereto together form an unsubstituted benzene ring or a benzene ring substituted with an alkyl group or a cycloalkyl group; and x is a natural number of 2 or more, preferably 2 to 5.

These may be used individually or in combination.

In formula (2), when $R_4$ is a linear or branched alkyl group, a $C_1$-$C_6$ alkyl group is preferred. When $R_4$ is a cycloalkyl group, a $C_6$-$C_8$ cycloalkyl group is preferred. When $R_4$ is an aryl group, a phenyl group is preferred. When $R_4$ is aralkyl, a $C_7$-$C_{10}$ aralkyl group is preferred. x is preferably 2. Further, in formula (2), when n is 2 and two $R_4$'s and carbon atoms bonded thereto together form an unsubstituted benzene ring or a benzene ring substituted with an alkyl group or a cycloalkyl group, preferred is an unsubstituted benzene ring or a benzene ring substituted with a $C_1$-$C_4$ alkyl group or a $C_6$-$C_8$ cycloalkyl group.

Specifically, there can be mentioned phosphorus compounds represented by the following formula (3) or formula (4):

(3)

or (4)

wherein $R_5$, represents a hydrogen atom, methyl, ethyl, n-propyl, isopropyl, n-butyl, isobutyl, sec-butyl, a tert-butyl group, or a cyclohexyl group.

In the present invention, as phenolic hydroxyl group-containing phosphorus compound (D), especially preferred are 10-(2,5-dihydroxyphenyl)-9,10-dihydro-9-oxa-10-phosphaphenanthrene-10-oxide and derivatives thereof.

As an example of a commercially available product used as phenolic hydroxyl group-containing phosphorus compound (D), there can be mentioned HCA-HQ, manufactured by SANKO CO., LTD.

In the present invention, with respect to inorganic filler (E), there is no particular limitation. Examples include silica, fused silica, talc, alumina, aluminum hydroxide, barium sulfate, calcium hydroxide, aerogel, and calcium carbonate. The inorganic filler include one treated with a coupling agent, such as a silane coupling agent, for improving dispersibility. These may be used individually or in combination. From the viewpoint of achieving excellent dielectric properties and low thermal expansion, preferred is silica, advantageously spherical silica.

In the insulating resin composition of the present invention, the amount of novolak epoxy resin having a biphenyl structure (A) incorporated may be 55 to 75% by weight, more preferably 62 to 72% by weight, based on the total weight of components (A) to (D). When the amount is within this range, the resistance to soldering heat is excellent, and the fluidity of the insulating resin composition during the application to a support is appropriate and a cured film of the resin composition is unlikely to have an uneven surface.

In the insulating resin composition of the present invention, the amount of carboxylic acid-modified acrylonitrile butadiene rubber particles (B) incorporated is preferably in the range of 2 to 10% by weight, more preferably 3 to 6% by weight, based on the total weight of components (A) to (D). When the amount is within this range, a film obtained by applying the insulating resin composition to a support is excellent in the appearance both before and after drying, so that a problem of unevenness caused in the roughening or lack of the insulation reliability hardly occurs.

With respect to the amounts of component (A) and component (B) incorporated, the {weight of component (A)}/{weight of component (B)} ratio is preferably 88/12 to 98/2, more preferably 93/17 to 97/3. When the ratio for the amounts is within this range, the resistance to soldering heat and insulation reliability are excellent, and a film obtained by applying the insulating resin composition to a support is excellent in the appearance and the fluidity of the insulating resin composition is appropriate, so that a problem in that the cured film is likely to have an uneven surface or a problem of unevenness caused in the roughening or lack of the insulation reliability hardly occurs.

In the insulating resin composition of the present invention, the amount of triazine ring-containing cresol novolak phenolic resin (C) incorporated may be 4 to 15% by weight, more preferably 5 to 9% by weight, based on the total weight of components (A) to (D). When the amount is within this range, satisfactory bond strength of a film of the insulating resin composition to a conductor layer can be secured without highly roughening the surface of the film, and the cured film has excellent dielectric loss and excellent coefficient of thermal expansion as well as excellent elongation, and a problem of an occurrence of burnout or a lowering of the dielectric loss in a thermal stress test hardly occurs.

In the insulating resin composition of the present invention, the amount of phenolic hydroxyl group-containing phosphorus compound (D) incorporated may be in the range of 1.5 to 2.5% by weight, more preferably in the range of 1.8 to 2.2% by weight, based on the total weight of components (A) to (D), in terms of a phosphorus atom. When the amount is within this range, the flame retardancy is excellent (e.g., rated V-0 as measured in accordance with the method described in UL-Subject 94) and the insulation reliability is excellent, and Tg of a cured film of the insulating resin composition is not too low.

In the insulating resin composition of the present invention, the ratio of the total number of hydroxyl groups in component (C) and hydroxyl groups in component (D) to the number of epoxy groups in component (A) (number of hydroxyl groups/number of epoxy groups) is preferably in the range of 0.6 to 1.3, more preferably 0.75 to 1.25. When the ratio is within this range, curing for the insulating resin composition is satisfactory and the dielectric loss and coefficient of thermal expansion of the cured film of the insulating resin composition can be lowered while securing a satisfactory elongation of the film. In addition, appropriate roughening is possible, so that satisfactory bond strength of the film to a conductor layer can be obtained.

Further, in the insulating resin composition of the present invention, the ratio of the number of hydroxyl groups in component (C) to the number of epoxy groups in component (A) (number of hydroxyl groups/number of epoxy groups) is preferably 0.15 to 0.50, more preferably 0.17 to 0.30. When the ratio is within this range, a film of the insulating resin composition has large elongation, and a problem of lack of the bond strength to a conductor layer does not occur.

In the insulating resin composition of the present invention, the amount of inorganic filler (E) incorporated is preferably in the range of 5 to 35% by volume, more preferably 10 to 30% by volume, based on the total volume of components (A) to (E). When the amount is within this range, the coefficient of thermal expansion and dielectric loss do not become large, and satisfactory fluidity for forming an insulating layer on an inner layer circuit can be obtained. For dispersing inorganic filler in the insulating resin composition of the present invention, a well-known kneading method, e.g., a kneader, a ball mill, a bead mill, or a three-roll mill can be used.

In the insulating resin composition of the present invention, as a reaction promoter, an imidazole or a $BF_3$ amine complex, which is a latent thermal curing agent, may be added. From the viewpoint of achieving excellent storage stability of the insulating resin composition and excellent handling properties of the resin composition when it is in a B-stage as well as excellent resistance to soldering heat, 2-phenylimidazole, 2-ethyl-4-methylimidazole, and 1-cyanoethyl-2-phenylimidazolium trimellitate are preferred. The amount of the reaction promoter incorporated is preferably in the range of 0.2 to 0.6% by weight, based on the weight of novolak epoxy resin having a biphenyl structure (A) in the insulating resin composition. When the amount is within this range, satisfactory resistance to soldering heat and excellent storage stability of the insulating resin composition as well as excellent handling properties of the resin composition when it is in a B-stage can be obtained.

In the insulating resin composition of the present invention, if necessary, an additive, such as a pigment, a leveling agent, a defoamer, or an ion trapping agent, may be added.

The insulating resin composition can be diluted with a solvent into a varnish and applied to an insulating substrate having an inner layer circuit formed, and cured to form an insulating layer. Examples of solvents include ketones, such as acetone, methyl ethyl ketone, and cyclohexanone; aromatic hydrocarbons, such as benzene, xylene, and toluene; alcohols, such as ethylene glycol monoethyl ether; esters, such as ethyl ethoxypropionate; and amides, such as N,N-dimethylformamide and N,N-dimethylacetamide. These solvents may be used individually or in combination. With respect to the amount of the solvent used in the insulating resin composition, there is no particular limitation, and the amount can be an amount conventionally employed.

An insulating film having a support can be formed by applying the insulating resin composition of the present invention or the above varnish onto at least one surface of a support and semi-curing it. Examples of supports include metal foils, such as copper and aluminum, and carrier films of resins, such as polyester, polyimide, and polyethylene terephthalate (PET).

When the insulating resin composition is applied in the form of a varnish to a carrier film or a copper foil by means of a comma coater, it is preferred that the amount of the solvent used is adjusted so that the solids content of the insulating resin composition becomes 40 to 70% by weight. Alternatively, in accordance with the equipment for forming a film, the amount of the solvent can be adjusted.

Specifically, steps for producing a multilayer wiring board using the insulating resin composition of the present invention are described with reference to FIG. 1. The steps for producing a multilayer wiring board are not limited to those described below.

First, circuit board 3 comprising first circuit pattern 1*a* formed on insulating substrate 2 is prepared {see FIG. 1-(*a*)}. As insulating substrate 2, a conventionally known laminate sheet used in a general wiring board, for example, glass cloth-epoxy resin, paper-phenolic resin, paper-epoxy resin, or glass cloth•glass paper-epoxy resin can be used, but there is no particular limitation.

Figure 1A:
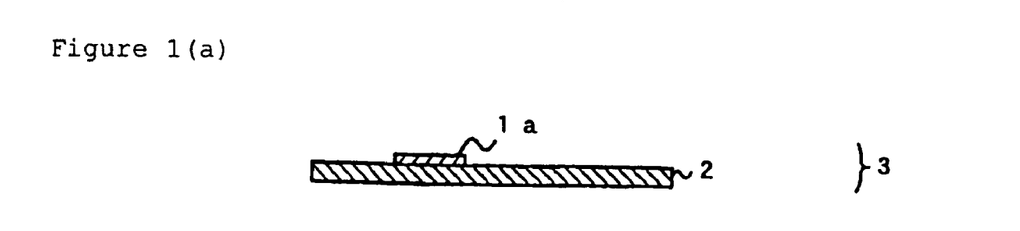
FIGS. 1(a) to 1(g) are cross-sectional views for explaining the steps for producing a multilayer wiring board.

With respect to the method for forming circuit pattern 1a, there is no particular limitation. For example, there can be employed a conventionally known method for producing a wiring board, such as a subtractive method in which a copper-clad laminate sheet obtained by laminating together a copper foil and the above insulating substrate is used and an unnecessary portion of the copper foil is etched away, or an additive method in which a circuit is formed by electroless plating on the required portion of the insulating substrate.

FIG. 1-(a) shows an example such that circuit pattern 1a is formed by etching the conductor layer formed on one surface of insulating substrate 2. Circuit pattern 1a can also be formed on both surfaces of insulating substrate 2 using a double-sided copper-clad laminate sheet.

Figure 1B:
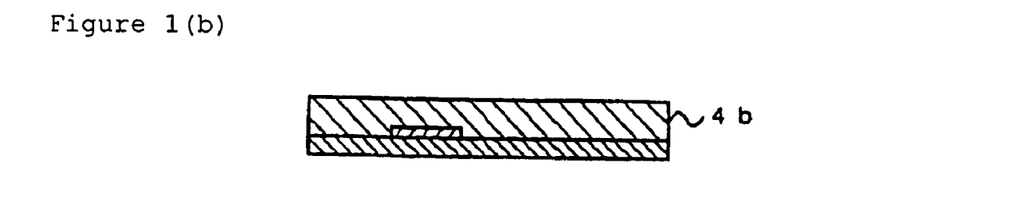

Next, the surface of circuit pattern 1a is subjected to roughening treatment so that the surface has appropriate bonding properties. With respect to the method for this treatment, there is no particular limitation, and there can be employed, for example, a conventionally known method in which copper oxide acicular crystal is formed on the surface of conductor layer 1a by an alkaline aqueous solution of sodium hypochlorite, and the copper oxide acicular crystal formed is reduced by dipping it in an aqueous solution of dimethylamineborane. Then, insulating resin composition layer 4b is formed on one surface or both surfaces of circuit board 3 having circuit pattern 1a. With respect to the method for forming the insulating resin composition layer, there is no particular limitation as long as the insulating resin composition of the present invention is used. For example, there can be mentioned a method in which the insulating resin composition of the present invention is applied onto one surface or both surfaces of circuit board 3 having circuit pattern 1a using a curtain coater or a roll coater to form an insulating resin composition layer 4b. There can be mentioned a method in which a layer is formed by lamination or pressing using a film having a support obtained by semi-curing or curing the insulating resin composition of the present invention. Then, the insulating resin composition layer is cured to obtain an insulating layer. When using a film having a support, the support is appropriately peeled off and the resin composition is cured. The temperature and time for curing can be determined by taking into consideration the subsequent plating treatment and annealing treatment for copper, for example, at 160 to 200° C. for 20 to 60 minutes. In this range, the resultant insulating layer has appropriate bonding properties to copper in the subsequent plating treatment, and is unlikely to suffer attack by an alkaline treatment solution during the plating treatment.

Figure 1C:
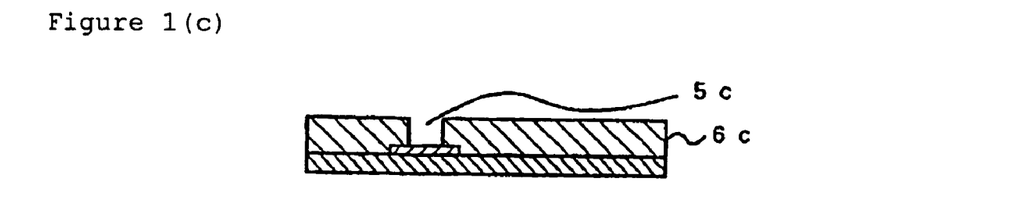

Further, for interlayer connection between inner layer circuit 1a and an outer layer circuit, hole 5c can be formed in the insulating layer. With respect to the method for forming the hole, there is no particular limitation. For example, a method conventionally known, such as a laser method or a sandblasting method, can be used.

Then, second circuit pattern 1d is formed on insulating layer 6c and a via hole is formed to make interlayer connection between first circuit pattern 1a and second circuit pattern 1d {see FIG. 1-(d)}.

Figure 1D:
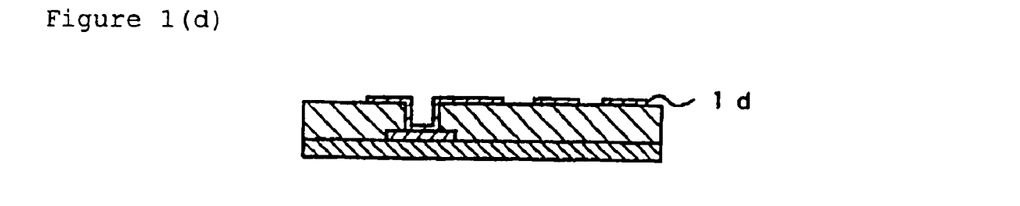

When the conductor layer is formed by a plating method, insulating layer 6c is first treated with an acidic roughening solution. As the acidic roughening solution, a chromium/sulfuric acid roughening solution, an alkaline permanganate roughening solution, a sodium fluoride/chromium/sulfuric acid roughening solution, or a tetrafluoroboric acid roughening solution can be used. Then, the resultant circuit board is subjected to neutralization treatment by dipping it in an aqueous hydrochloric acid solution of stannous chloride, and further subjected to seeding treatment for depositing palladium by dipping it in a palladium chloride solution.

Figure 1E:
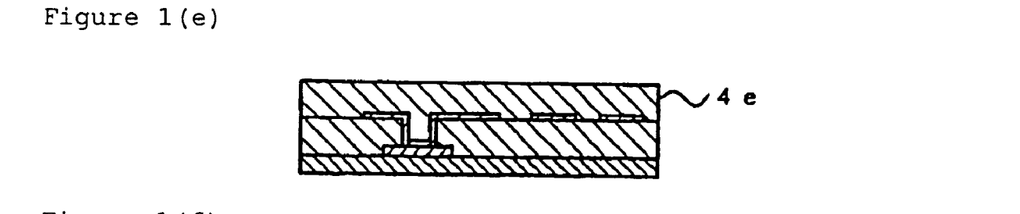
Figure 1F:
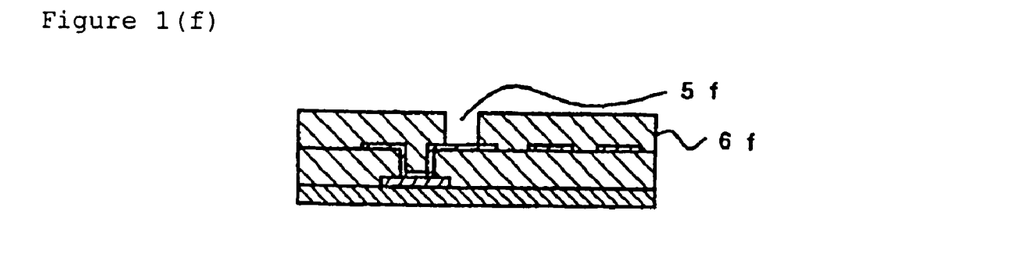
Figure 1G:
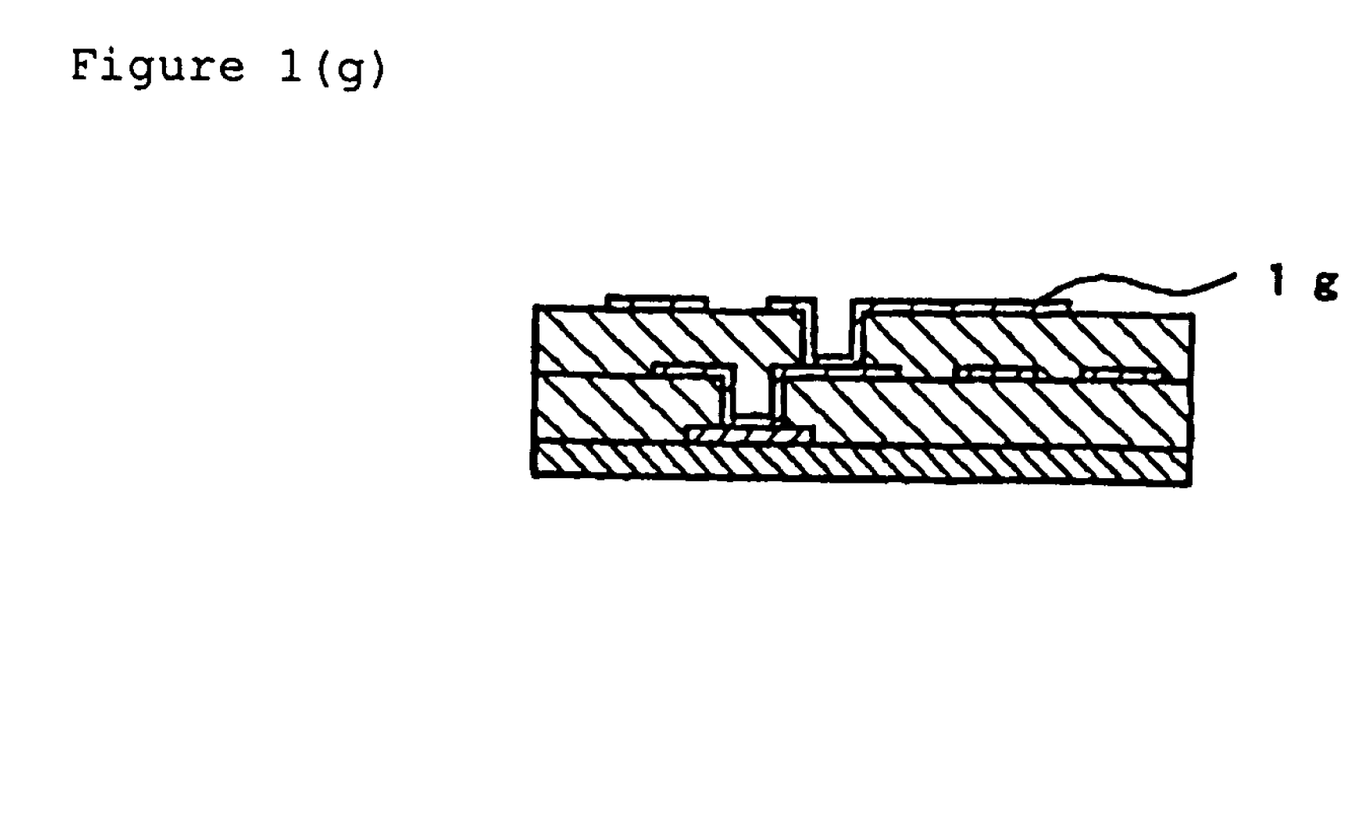

Next, the resultant circuit board is immersed in an electroless plating solution to deposit an electroless plated layer having a thickness of 0.3 to 1.5 µm on insulating layer 6c, and, if necessary, further subjected to plating so that the conductor layer has an appropriate thickness. With respect to the electroless plating solution and the method for plating, there is no particular limitation and those conventionally known can be used. Then, an unnecessary portion is etched away to form circuit pattern 1d. The insulating resin composition of the present invention is applied onto one surface or both surfaces of circuit board 3 having circuit pattern 1a using a curtain coater or a roll coater to form an insulating resin composition layer 4e {see FIG. 1-(e)}.

Alternatively, circuit pattern 1d can be formed by, after roughening of the insulating layer and seeding, forming a mask from a plating resist and depositing an electroless plated layer only on the required portion, and then removing the plating resist. Further, when an insulating film having a support comprised of a copper foil is used in the formation of the insulating layer, the second circuit pattern can be formed by an etching process. With respect to the etching process, there is no particular limitation, and a pattern plating process using a very thin copper foil having a thickness as small as 3 µm can be used.

Then, circuit pattern 1d is subjected to roughening treatment in the same manner as that mentioned above to form second insulating layer 6f, and further, third circuit pattern 1g is formed to make interlayer connection between second circuit pattern 1d and third circuit pattern 1g {see FIG. 1-(f) and FIG. 1-(g)}.

A multilayer wiring board comprising a number of layers can be produced by repeating a series of the above steps.

The insulating resin composition, insulating film having a support, and multilayer wiring board of the present invention can be used in electronic parts, such as LSI and chip parts.

EXAMPLES

Hereinbelow, the present invention will be described in detail with reference to the following specific Examples, which should not be construed as limiting the scope of the present invention.

Example 1

(1) A glass cloth-base epoxy resin double-sided copper-clad laminate sheet (MCL-E-67, manufactured by Hitachi Chemical Co., Ltd.; having double-sided roughened foils on both surfaces; copper foil thickness: 18 µm; substrate thickness: 0.8 mm) was etched to prepare a circuit board having on one surface thereof a circuit pattern (hereinafter, referred to as "first circuit pattern").

(2) A varnish of an insulating resin composition having the formulation shown below was prepared. The varnish of an insulating resin composition was applied to a PET film, and dried at 100° C. for 10 minutes to prepare a film roll having an insulating resin with a thickness of 50±3 µm. The film having an insulating resin was laminated using a batch-mode vacuum air-pressed laminator (MVLP-500, manufactured by Meiki Co., Ltd.) onto one surface of the above-prepared circuit board so that the insulating resin was in contact with the first circuit pattern.

| Biphenyl epoxy resin, NC3000S-H (manufactured by Nippon Kayaku Co., Ltd.) | 80 Parts by weight |
|---|---|
| Carboxylic acid-modified acrylonitrile butadiene rubber particles, XER-91SE-15 (manufactured by JSR Corporation) | 5 Parts by weight |
| Triazine ring-containing cresol novolak phenolic resin, PHENOLITE EXB-9829 (manufactured by Dainippon Ink & Chemicals Incorporated; nitrogen content: 18%; hydroxyl equivalent: 151) | 9 Parts by weight |
| Phosphorus-containing compound, HCA-HQ (manufactured by SANKO CO., LTD.) | 26 Parts by weight |
| Inorganic filler, spherical silica, ADMAFINE SC-2050 (manufactured by Admatechs Co., Inc.) | 40 Parts by weight |
| Imidazole derivative compound, 1-cyanoethyl-2-phenylimidazolium trimellitate, 2PZ-CNS (manufactured by Shikoku Corporation) | 0.24 Part by weight |
| Solvent, methyl ethyl ketone | 55 Parts by weight |

(3) The PET film was peeled off the film having an insulating resin laminated onto the circuit board, and the insulating resin was cured under conditions for curing at 180° C. for 60 minutes to form a first insulating layer.

(4) A hole for interlayer connection was formed in the first insulating layer using a $CO_2$ laser processing machine (model LCO-1B21, manufactured by Hitachi Via Mechanics, Ltd.) under conditions such that the beam diameter was 80 μm, the frequency was 500 Hz, the pulse width was 5 μsec, and the shot count was 7.

(5) The circuit board having a hole formed therein was immersed in a swelling solution (aqueous solution of diethylene glycol monobutyl ether: 200 ml/l, NaOH: 5 g/l) heated to 70° C. for 5 minutes, and subsequently immersed in a roughening solution (aqueous solution of $KMnO_4$: 60 g/l, NaOH: 40 g/l) heated to 80° C. for 10 minutes, and then immersed in a neutralization solution-(aqueous solution of $SnCl_2$: 30 g/l, HCl: 300 ml/l) at room temperature for 5 minutes to effect neutralization, thus roughening the first insulating layer.

(6) For forming a second circuit pattern on the roughened surface of the first insulating layer, the circuit substrate was first immersed in a catalyst solution for electroless plating containing $PdCl_2$ (HS-202B, manufactured by Hitachi Chemical Co., Ltd.) at room temperature for 10 minutes, and washed with water, and then immersed in an electroless copper plating solution (CUST-201, manufactured by Hitachi Chemical Co., Ltd.) at room temperature for 15 minutes, followed by copper sulfate plating. Then, annealing was conducted at 180° C. for 30 minutes to form a conductor layer having a thickness of 20 μm on the surface of the insulating layer. Next, an oxide film on the copper surface of the conductor layer was removed by polishing using a #600 buff, and then an etching resist was formed and an unnecessary portion was etched, and then the etching resist was removed to form a second circuit pattern connected to the first circuit pattern through a via hole.

(7) Further, for forming a multilayer structure, the conductor surface of the second circuit pattern was immersed in an aqueous solution of sodium chlorite: 50 g/l, NaOH: 20 g/l, and sodium triphosphate: 10 g/l at 85° C. for 20 minutes, and washed with water, and then dried at 80° C. for 20 minutes to form an uneven copper oxide surface on the conductor surface of the second circuit pattern.

(8) Furthermore, a series of steps (2) to (6) was repeated to prepare a multilayer wiring board comprising three layers.

Example 2

Substantially the same procedure as in Example 1 was repeated except that the amount of the biphenyl epoxy resin (NC3000S-H) incorporated was changed from 80.0 parts by weight to 82.8 parts by weight, and that the amount of the triazine ring-containing cresol novolak phenolic resin (PHENOLITE EXB-9829) incorporated was changed from 9.0 parts by weight to 12.2 parts by weight.

Example 3

Substantially the same procedure as in Example 1 was repeated except that, instead of 40.0 parts by weight of the spherical silica as inorganic filler, 40.0 parts by weight of aluminum hydroxide (HYGILITE H-42M, manufactured by SHOWA DENKO K.K.) was used.

Comparative Example 1

Substantially the same procedure as in Example 1 was repeated except that, instead of 9.0 parts by weight of the triazine ring-containing cresol novolak phenolic resin (PHENOLITE EXB-9829), 4.7 parts by weight of a phenolic novolak resin (HP-850, manufactured by Hitachi Chemical Co., Ltd.; hydroxyl equivalent: 106) was used.

Comparative Example 2

Substantially the same procedure as in Example 1 was repeated except that, instead of 9.0 parts by weight of the triazine ring-containing cresol novolak phenolic resin (PHENOLITE EXB-9829), 5.2 parts by weight of a cresol novolak phenolic resin (KA-1165, manufactured by Dainippon Ink & Chemicals Incorporated; hydroxyl equivalent: 119) was used.

Comparative Example 3

Substantially the same procedure as in Example 1 was repeated except that, instead of 9.0 parts by weight of the triazine ring-containing cresol novolak phenolic resin (PHENOLITE EXB-9829), 5.3 parts by weight of a phenolic novolak type triazine ring-containing phenolic resin (PHENOLITE LA-7032, manufactured by Dainippon Ink & Chemicals Incorporated; nitrogen content: 5%; hydroxyl equivalent: 120) was used.

Comparative Example 4

Substantially the same procedure as in Example 1 was repeated except that, instead of 9.0 parts by weight of the triazine ring-containing cresol novolak phenolic resin EXB-9829, 6.4 parts by weight of a phenolic novolak type triazine ring-containing phenolic resin PHENOLITE LA-1356 (manufactured by Dainippon Ink & Chemicals Incorporated; nitrogen content: 19%; hydroxyl equivalent: 146) was used.

The thus prepared multilayer wiring boards in Examples 1 to 3 and Comparative Examples 1 to 4 were individually examined with respect to flame retardancy, bond strength to an outer layer circuit, surface roughness after roughening an insulating layer, elongation of an insulating layer (film), crack generation rate in an insulating layer in a thermal shock test, insulation reliability accelerated test in an unsaturated atmosphere, 288° C. soldering heat resistance test, coefficient of thermal expansion, and permittivity and dielectric loss of an insulating resin alone. The results are shown in Table 1.

Flame Retardancy

In the step in each of Examples 1 to 3 and Comparative Examples 1 to 4, a glass cloth-base epoxy resin double-sided copper-clad laminate sheet (MCL-E-67, manufactured by Hitachi Chemical Co., Ltd.; having double-sided roughened foils on both surfaces; copper foil thickness: 18 μm) was etched to prepare a substrate (having no circuit pattern formed), and then the insulating resin composition in Example 1 was applied to both surfaces of the substrate so that the thickness of the insulating layer on one side became 150 μm, and heated at 180° C. for 1 hour to prepare a test specimen for flame retardancy. The test specimen was examined in accordance with the method described in UL-Subject 94.

Elongation of Film

In the step in each of Examples 1 to 3 and Comparative Examples 1 to 4, the obtained varnish of an insulating resin composition was applied to a copper foil and dried at 80° C. for 10 minutes, and cured at 180° C. for 60 minutes and subjected to plating, and then subjected to annealing at 180° C. for 30 minutes, followed by removal of copper by etching, to obtain a cured insulating resin film. The film was cut out into a specimen having a width of 10 mm, a film thickness of 50 μm, and a length of 100 mm, and stretched by means of an autograph tensile tester (distance between chucks: 50 mm) to determine an elongation at breakage.

Bond Strength to Outer Layer Circuit

In each of the multilayer wiring boards obtained in Examples 1 to 3 and Comparative Examples 1 to 4, one end of a portion (width: 10 mm; length: 100 mm) of L1 conductor layer (third circuit layer) was peeled and held by a chuck (100 kg tensilometer, manufactured by Toyo-Boldwin Co.), and peeled off about 50 mm in the vertical direction at room temperature to measure a load at that time.

Surface Roughness After Roughening

In each of the multilayer wiring boards obtained in Examples 1 to 3 and Comparative Examples 1 to 4, the outer layer circuit (third circuit pattern) was etched in an aqueous solution of ammonium persulfate to remove copper, thus preparing a test specimen. The test specimen was cut out into a 2 mm square, and surface roughness (Rz) was measured with respect to different three points on the test specimen using an ultra depth form measurement microscope, model VK-8500, manufactured by KEYENCE CORPORATION, under conditions such that the measurement length was 149 μm, the magnification was 2,000, and the resolution was 0.05 μm, and an average value of the values of three points obtained by subtracting the minimum roughness from the maximum roughness in the measurement length of 149 μm was calculated as surface roughness (Rz) after roughening.

Accelerated Life Test: Insulation Reliability Accelerated Test in Unsaturated Atmosphere In each of the multilayer wiring boards prepared in Examples 1 to 3 and Comparative Examples 1 to 4, for applying a voltage in the interlayer direction of the insulating layer, a lead wire was fixed by soldering to a terminal portion. Then, a voltage of 50 V was applied at room temperature for 1 minute to measure an insulation resistance in the interlayer direction of the insulating layer. Further, a direct voltage of 6 V was applied to the resultant specimen in an unsaturated atmosphere at 130° C. at 85% RH, and taken out of the atmosphere per 50 hours and a period of time required for exhibiting a resistance value of $10^8$ Ω or more when a voltage of 50 V was applied to the specimen at room temperature for 1 minute was determined as a time for the insulation reliability.

288° C. Soldering Heat Resistance

Each of the multilayer wiring boards prepared in Examples 1 to 3 and Comparative Examples 1 to 4 was cut out into a 25 mm square, and placed in a solder bath adjusted at 288±2° C. to measure a period of time until blistering occurred.

Coefficient of Thermal Expansion

In the step in each of Examples 1 to 3 and Comparative Examples 1 to 4, the obtained varnish of an insulating resin composition was applied to a copper foil and dried at 80° C. for 10 minutes, and cured at 180° C. for 60 minutes and subjected to copper plating, and then subjected to annealing at 180° C. for 30 minutes, followed by removal of copper on the both surfaces by etching, to obtain an insulating resin film. The film was cut out into a specimen having a width of 4 mm, a film thickness of 50 μm, and a length of 20 mm, and subjected to measurement using 2000 model thermal analysis system 943TMA (manufactured by Du Pont Co.) under conditions at a load of 5 g by a tensile method to determine an average coefficient of thermal expansion in the range of 30 to 100° C.

Dielectric Constant and Dielectric Loss Tangent

In the step in each of Examples 1 to 3 and Comparative Examples 1 to 4, the obtained varnish of an insulating resin composition was applied to a copper foil and dried at 80° C. for 10 minutes, and cured at 180° C. for 60 minutes and subjected to copper plating, and then subjected to annealing at 180° C. for 30 minutes, followed by removal of copper on the both surfaces by etching, to obtain an insulating resin film. The film was cut out into a specimen having a width of 1.7 mm, a film thickness of 50 μm, and a length of 100 mm, and subjected to measurement using a cavity resonance meter HP8753ES (manufactured by Kanto Denshi Corporation) to determine a dielectric constant ($\in$r) and a dielectric loss tangent (tan δ) at 1 GHz.

TABLE 1

|  |  | Example 1 | Example 2 | Example 3 | Comparative Example 1 | Comparative Example 2 | Comparative Example 3 | Comparative Example 4 |
|---|---|---|---|---|---|---|---|---|
| Biphenyl epoxy resin | NC3000S-H | 80 | 82.8 | 80 | 80 | 80 | 80 | 80 |
| Acrylonitrile butadiene rubber particles | XER-91 se-15 | 5 | 5 | 5 | 5 | 5 | 5 | 5 |
| Triazine ring-containing cresol novolak phenolic resin | PHENOLITE EXB-9829 (18%) | 9.0 | 12.2 | 9.0 | 0 | 0 | 0 | 9.0 |
| Triazine ring-containing | PHENOLITE LA-7032 (5%) | 0 | 0 | 0 | 0 | 0 | 5.3 | 0 |

TABLE 1-continued

|  |  | Example 1 | Example 2 | Example 3 | Comparative Example 1 | Comparative Example 2 | Comparative Example 3 | Comparative Example 4 |
|---|---|---|---|---|---|---|---|---|
| phenolic novolak resin | PHENOLITE LA-1356 (19%) | 0 | 0 | 0 | 0 | 0 | 0 | 6.4 |
| Phenolic novolak resin | HP-850 | 0 | 0 | 0 | 4.7 | 0 | 0 | 0 |
| Cresol novolak resin | KA-1165 | 0 | 0 | 0 | 0 | 5.2 | 0 | 0 |
| Phosphorus compound | HCA-HQ | 26 | 26 | 26 | 26 | 26 | 26 | 26 |
| Inorganic filler | Spherical silica | 40 | 40 | 0 | 40 | 40 | 40 | 40 |
|  | Aluminum hydroxide | 0 | 0 | 40 | 0 | 0 | 0 | 0 |
| Imidazole derivative | 2PZ-CNS | 0.24 | 0.24 | 0.24 | 0.24 | 0.24 | 0.24 | 0.24 |
| Solvent | Methyl ethyl ketone | 55 | 55 | 55 | 55 | 55 | 55 | 55 |
| Hydroxyl group/epoxy group[*1] |  | 0.81 | 0.96 | 0.96 | 0.75 | 0.75 | 0.75 | 0.81 |
| Hydroxyl group/epoxy group2[*2] |  | 0.22 | 0.25 | 0.22 | 0.16 | 0.16 | 0.16 | 0.22 |
| Flame retardancy (UL-94) | (—) | V-0 | V-0 | V-0 | V-0 | V-0 | V-0 | V-0 |
| Elongation of film | (%) | 8 | 7 | 7 | 5 | 4 | 5 | 4 |
| Surface roughness after roughening (Rz) | (—) | 1~2 | 1~2 | 1~2 | 1~2 | 1~2 | 1~2 | 4~5 |
| Bond strength | (kN/m) | 0.9 | 0.8 | 0.9 | 0.4 | 0.3 | 0.4 | 0.6 |
| Insulation reliability accelerated test | (h) | >300 | >300 | >300 | >300 | >300 | >300 | 150~300 |
| 288° C. Soldering heat resistance | (分) | >60 | >60 | >60 | >60 | >60 | >60 | >60 |
| Coefficient of thermal expansion | ($\times 10^{-6}$/C) | 40 | 42 | 40 | 53 | 51 | 59 | 52 |
| Dielectric constant ($\varepsilon r$) | (—) | 3.1 | 3.0 | 3.1 | 3.3 | 3.3 | 3.4 | 3.1 |
| Dielectric loss tangent (tan$\delta$) | (—) | 0.013 | 0.014 | 0.015 | 0.021 | 0.021 | 0.026 | 0.014 |

[*1](Total number of hydroxyl groups in triazine ring-containing phenolic resin and phosphorus compound)/(Number of epoxy groups in biphenyl epoxy resin)
[*2](Number of hydroxyl groups in triazine ring-containing phenolic resin)/(Number of epoxy groups in biphenyl epoxy resin)
Note that the triazine ring-containing phenolic resins in Comparative Examples 2 and 3 are a phenolic novolak resin and a cresol novolak rein.

From the table, as can be seen in Examples 1 to 3, the multilayer wiring board using the insulating resin composition of the present invention has such properties that the flame retardancy is excellent, a film formed from the insulating resin composition has large elongation and has excellent bond strength to a circuit pattern although the surface roughness of the film after being roughened is small, and hence the film is advantageous in the refining of wiring, and the insulation reliability and 288° C. soldering heat resistance are excellent. Further, it has been illustrated that a multilayer wiring board having excellent coefficient of thermal expansion and excellent dielectric properties can be produced.

In contrast, the multilayer wiring boards in Comparative Examples 1 to 4, each of which does not essentially contain the insulating resin composition of the present invention, have been illustrated to be poor in the coefficient of thermal expansion, dielectric properties, and bond strength to a circuit conductor.

INDUSTRIAL APPLICABILITY

The insulating resin composition of the present invention is advantageous not only in that it exhibits flame retardancy although it is free of a halogen, but also in that a film formed from the insulating resin composition exhibits such a large elongation that the film can endure mechanical or thermal stress concentration, a coefficient of thermal expansion equivalent to that of a structure containing glass cloth, and excellent high frequency properties, and an insulating film having a support using the insulating resin composition and a multilayer wiring board can meet the recent demands of electronic apparatus wherein they should be miniaturized and lightweight and have many functions.

What is claimed is:

1. An insulating film comprising an insulating layer and a support, wherein the insulating layer is obtained by semi-curing an insulating resin composition on a surface of the support, the insulating resin composition comprising:

(A) a novolak epoxy resin having a biphenyl structure;

(B) carboxylic acid-modified acrylonitrile butadiene rubber particles;

(C) a triazine ring-containing cresol novolak phenolic resin having a nitrogen content of 12 to 22% by weight;

(D) a phenolic hydroxyl group-containing phosphorus compound; and (E) inorganic filler, wherein the amount of novolak epoxy resin is 55% to 75%, by weight, of the insulating resin composition based on the total weight of components (A) to (D), and wherein the amount of carboxylic acid-modified acrylonitrile butadiene rubber particles is 2% to 10%, by weight, of the insulating resin composition based on the total weight of components (A) to (D), and wherein the amount of triazine ring-containing cresol novolak phenolic resin is 4% to 15%, by weight, of the insulating resin composition based on the total weight of components (A) to (D), and wherein the amount of the phenolic hydroxyl group-containing phosphorus compound is 1.5% to 2.5%, by weight, of the insulating resin composition based on the total weight of components (A) to (D) in terms of a phosphorus atom, and wherein the amount of the inorganic filler is 5% to 35%, by volume, of the insulating resin composition based on the total volume of components (A) to (E).

2. A multilayer wiring board comprising at least one insulating layer, at least one inner layer circuit, at least one outer layer circuit and a substrate, wherein said insulating layer is obtained by curing an insulating layer of an insulating film according to claim 1.

3. A multilayer wiring board comprising at least one insulating layer, at least one inner layer circuit, at least one outer layer circuit and a substrate, wherein said insulating layer is obtained by curing an insulating resin composition according to claim 1.

4. An insulating film as recited by claim 1, wherein the triazine ring-containing cresol novolak phenolic resin has a number average molecular weight of 500 to 600.

5. An insulating film as recited by claim 1, wherein the inorganic filler comprises spherical silica.

6. An insulating film as recited by claim 5, wherein the spherical silica has been treated with a silane coupling agent.

7. An insulating film comprising an insulating layer and a support, wherein the insulating layer is obtained by semi-curing an insulating resin composition on a surface of the support, the insulating resin composition comprising:
- (A) a novolak epoxy resin having a biphenyl structure;
- (B) carboxylic acid-modified acrylonitrile butadiene rubber particles;
- (C) a triazine ring-containing cresol novolak phenolic resin having a nitrogen content of 12 to 22% by weight, and wherein the triazine ring-containing cresol novolak phenolic resin has a number average molecular weight of 500 to 600;
- (D) a phenolic hydroxyl group-containing phosphorus compound; and
- (E) inorganic filler, wherein the amount of novolak epoxy resin is 55% to 75%, by weight, of the insulating resin composition based on the total weight of components (A) to (D), and wherein the amount of carboxylic acid-modified acrylonitrile butadiene rubber particles is 2% to 10%, by weight, of the insulating resin composition based on the total weight of components (A) to (D), wherein the amount of triazine ring-containing cresol novolak phenolic resin is 4% to 15%, by weight, of the insulating resin composition based on the total weight of components (A) to (D), and wherein the amount of the phenolic hydroxyl group-containing phosphorus compound is 1.5% to 2.5%, by weight, of the insulating resin composition based on the total weight of components (A) to (D) in terms of a phosphorus atom, and wherein the amount of the inorganic filler is 5% to 35%, by volume, of the insulating resin composition based on the total volume of components (A) to (E).

8. An insulating film comprising an insulating layer and a support, wherein the insulating layer is obtained by semi-curing an insulating resin composition on a surface of the support, the insulating resin composition comprising:
- (A) a novolak epoxy resin having a biphenyl structure;
- (B) carboxylic acid-modified acrylonitrile butadiene rubber particles;
- (C) a triazine ring-containing cresol novolak phenolic resin having a nitrogen content of 12 to 22% by weight;
- (D) a phenolic hydroxyl group-containing phosphorus compound; and
- (E) inorganic filler comprising spherical silica that has been treated with a silane coupling agent, wherein the amount of novolak epoxy resin is 55% to 75%, by weight, of the insulating resin composition based on the total weight of components (A) to (D), and wherein the amount of carboxylic acid-modified acrylonitrile butadiene rubber particles is 2% to 10%, by weight, of the insulating resin composition based on the total weight of components (A) to (D), wherein the amount of triazine ring-containing cresol novolak phenolic resin is 4% to 15%, by weight, of the insulating resin composition based on the total weight of components (A) to (D), and wherein the amount of the phenolic hydroxyl group-containing phosphorus compound is 1.5% to 2.5%, by weight, of the insulating resin composition based on the total weight of components (A) to (D) in terms of a phosphorus atom, and wherein the amount of the inorganic filler is 5% to 35%, by volume, of the insulating resin composition based on the total volume of components (A) to (E).

9. A process for producing a multilayer wiring board, which comprises the steps of:
- (i) peeling the support from the insulating film according to claim 1 and laminating the insulating layer on an inner layer circuit formed on one or both surfaces of a substrate, wherein the insulating resin composition of the insulating layer is made to be in contact with the inner layer circuit;
- (ii) curing said insulating resin composition to obtain an insulating layer; and
- (iii) forming an outer layer circuit on the surface of said insulating layer.

* * * * *